(12) United States Patent
Lee et al.

(10) Patent No.: US 6,607,654 B2
(45) Date of Patent: Aug. 19, 2003

(54) COPPER-PLATING ELECROLYTE CONTAINING POLYVINYLPYRROLIDONE AND METHOD FOR FORMING A COPPER INTERCONNECT

(75) Inventors: Sun-jung Lee, Seoul (KR); Kyu-hwan Chang, Kyungki-do (KR); Hyeon-deok Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/899,228

(22) Filed: Jul. 6, 2001

(65) Prior Publication Data

US 2002/0036144 A1 Mar. 28, 2002

(30) Foreign Application Priority Data

Sep. 27, 2000 (KR) .......................... 2000-56715

(51) Int. Cl.⁷ .................................. C25D 3/38
(52) U.S. Cl. ................ 205/296; 205/291; 205/297; 205/298; 106/1.18
(58) Field of Search ................ 205/291, 296, 205/297, 298; 106/1.18

(56) References Cited

U.S. PATENT DOCUMENTS

| 4,134,803 A | | 1/1979 | Eckles et al. |
| 4,272,335 A | * | 6/1981 | Combs ................ 205/298 |
| 4,347,108 A | | 8/1982 | Willis |
| 5,328,589 A | | 7/1994 | Martin |
| 5,501,154 A | | 3/1996 | Rodney et al. |
| 5,730,854 A | | 3/1998 | Martin |
| 5,733,429 A | | 3/1998 | Martin et al. |
| 5,849,171 A | | 12/1998 | Dahms et al. |
| 6,024,857 A | | 2/2000 | Reid |

FOREIGN PATENT DOCUMENTS

EP    0785297 A2  *  7/1997

\* cited by examiner

*Primary Examiner*—Nam Nguyen
*Assistant Examiner*—Wesley A. Nicolas
(74) *Attorney, Agent, or Firm*—Lee & Sterba, P.C.

(57) ABSTRACT

A copper-plating electrolyte includes an aqueous copper salt solution, a water-soluble β-naphtholethoxylate compound having the formula

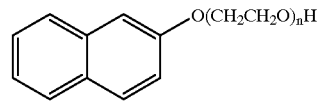

wherein n is an integer from 10 to 24, one selected from the group consisting of a disulfide having the formula $XO_3S(CH_2)_3SS(CH_2)_3SOX_3$ and a water-soluble mercaptopropanesulfonic acid or salt thereof having the formula $HS(CH_2)_3SO_3X$, where X is sodium, potassium, or hydrogen, a water-soluble polyethylene glycol having a molecular weight ranging from about 4,600 to about 10,000, and a water-soluble polyvinylpyrrolidone having a molecular weight ranging from about 10,000 to about 1,300,000.

19 Claims, 2 Drawing Sheets

COPPER-PLATING ELECROLYTE CONTAINING POLYVINYLPYRROLIDONE AND METHOD FOR FORMING A COPPER INTERCONNECT

BACKGROUND OF THE INVENTION

1. Field of the Invention

The present invention relates to electroplating, and more particularly, to an electrolyte for use in plating copper to form interconnects of a semiconductor device, and an electroplating method using the same.

2. Description of the Related Art

As semiconductor devices become more highly integrated, the use of copper in forming interconnects of semiconductor devices is increasing due to its low resistance. When copper is used to form interconnects, a conventional metal interconnect forming process including deposition and etching of the metal layer cannot be applied, because copper is incapable of dry etching. Thus, a damascene process is applied to form copper interconnects: via holes or trenches corresponding to a desired interconnect pattern are formed in a substrate and are filled with copper by electroplating, and then the copper layer is etched by chemical mechanical polishing (CMP).

As described above, the electroplating process is necessary to form the copper interconnect. However, a problem occurs in filling the via hole or trench by electroplating. As pattern size becomes smaller with the increase in the integration density of semiconductor devices, the aspect ratio of the via hole to be filled increases. As a result, uniform filling of the via hole becomes difficult. For example, the entrance of a via hole having a relatively high current density is first filled, rather than the inside of the via hole, thereby resulting in voids within the via hole. As a result, the resistance of the interconnect increases. To overcome these problems, a polymer capable of suppressing adsorption of copper on the wide flat surface of interconnect patterns, and capable of filling the via hole or trench by facilitating the growth of the plated layer from the bottom of the via hole or trench, is added. However, as the pattern size becomes smaller and the aspect ratio becomes larger, it becomes difficult to use a polymer additive to improve the filling characteristic.

Meanwhile, the flatness of the surface of a copper layer formed by electroplating affects the following CMP process. Since the section of the substrate which has undergone an etching process to form interconnect patterns has grooves (via holes or trenches) and projections, a copper layer deposited on the substrate by electroplating has steps. With regard to planarizing the surface of the copper layer to eliminate the steps, which is referred to as "leveling", many approaches have been taken to improve the flatness of the copper layer by addition of a brightener, a leveler and/or a wetting agent, as shown, for example, in U.S. Pat. Nos. 4,134,803 and 5,849,171. U.S. Pat. No. 4,134,803 discloses a copper-plating electrolyte containing a disulfide having the formula of $[RRNNCS_2]_2$, and a halo hydroxy sulfonic acid having the formula of $X(CH_2)_nCHOH-CH_2SO_3M$. Meanwhile, U.S. Pat. No. 5,849,171 discloses a copper-plating electrolyte containing a naphthol compound such as a β-naphtholalkoxylate, as a wetting agent, and a phenazonium compound.

Besides the additives disclosed in the above-mentioned references, a variety of polymer additives have been suggested to improve the flatness of the copper layer. However, since the above-mentioned references are limited to filling just a through hole of a printed circuit board (PCB) or to improving the glossiness of plating for aesthetic purpose, the conventional electrolytes cannot be applied in forming a highly integrated semiconductor device having a fine pattern less than 1 μm. As an example of the limitation, the copper layer deposited on a region having a relatively high pattern density swells up so that the region becomes thicker than other regions. This phenomenon is referred to as overplating. The margin of thickness removed by CMP is so small that the substrate with the overplated copper layer cannot be polished into a uniform surface, which acts as a defective factor.

In general, both smaller patterns having a critical dimension (CD) less than 1 μm and a high aspect ratio, and larger patterns having a CD larger than 1 μm and a low aspect ratio exist on the semiconductor substrate. As previously described, overplating, i.e., excessive growing of plated layer, occurs on the region having a relatively high pattern density with a CD less than 1 μm. On the other hand, the thickness of the plated layer on the region having a relatively large CD becomes thin. The poor flatness of the plated layer makes application of the subsequent CMP process difficult.

As described above, in order for electroplating with copper to be applied in manufacturing semiconductor devices, there is a need for an electroplating technique capable of filling a fine pattern less than 1 μm, and capable of uniformly plating copper over the fine pattern to ensure a successful CMP process after the plating process.

SUMMARY OF THE INVENTION

A feature of the present invention is to provide a copper-plating electrolyte, and a method for forming a copper interconnect of a semiconductor device by electroplating using the electrolyte, in which a via hole or trench having a critical dimension (CD) less than 0.3 μm and an aspect ratio greater than 4, which is formed in a semiconductor device having a fine pattern less than 1 μm, particularly, a CD of 0.13 μm, can be smoothly filled with the electrolyte, resulting in the copper interconnect having excellent surface flatness.

According to an aspect of the present invention, there is provided a copper-plating electrolyte. The copper-plating electrolyte includes an aqueous copper salt solution, a water-soluble β-naphtholethoxylate compound having the formula

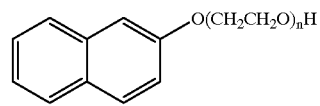

where n is an integer from 10 to 24, a disulfide having the formula $XO_3S(CH_2)_3SS(CH_2)_3SOX_3$ or a water-soluble mercaptopropanesulfonic acid or salt thereof having the formula $HS(CH_2)_3SO_3X$, where X is sodium, potassium, or hydrogen, a water-soluble polyethylene glycol having a molecular weight ranging from about 4,600 to about 10,000, and a water-soluble polyvinylpyrrolidone having a molecular weight ranging from about 10,000 to about 1,300,000.

According to another aspect of the present invention, there is provided an electroplating method for forming a copper interconnect of a semiconductor device. The electroplating method includes the steps of forming a predetermined pattern containing a trench or via hole, preferably having a critical dimension (CD) less than 1 μm and an aspect ratio larger than 4, on a semiconductor substrate, and electroplating the semiconductor substrate having the predetermined pattern with a copper-plating electrolyte as described herein.

In particular embodiments, the aqueous copper salt solution contains chlorine ions.

In more specific embodiments, the amount of the disulfide or the mercaptopropanesulfonic acid or salt thereof is in the range from about 0.001 to about 0.05 g per liter, the amount of the polyethylene glycol is in the range from about 0.001 to about 10 g per liter, the amount of the β-naphtholethoxylate is in the range from about 0.05 to about 3.0 g per liter, and the amount of the polyvinylpyrrolidone is in the range from about 0.001 to about 0.2 g per liter.

Semiconductor devices produced according to the inventive method are also provided.

According to the present invention, a via hole or trench having a CD less than 0.3 μm and an aspect ratio greater than 4 can be fully filled with the electrolyte without causing voids therein. In addition, no overplating occurs in regions including a relatively large number of such small via holes or trenches.

BRIEF DESCRIPTION OF THE DRAWINGS

The foregoing and other features and advantages of the present invention will become more apparent by describing in detail preferred embodiments thereof with reference to the attached drawings in which.

DETAILED DESCRIPTION OF THE INVENTION

Figure 1:
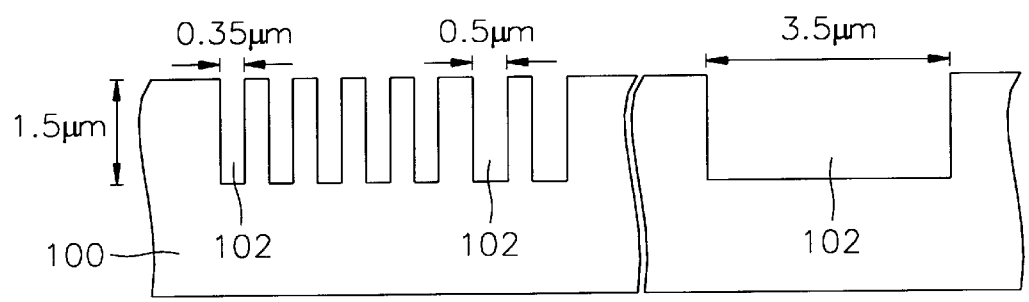
FIG. 1 is a schematic view of a substrate having a predetermined pattern which is used to measure the filling characteristic of a copper-plating electrolyte according to the present invention, and the flatness of the plated copper layer.

Priority Korean Patent Application No. 00-56715, filed Sep. 27, 2000, is incorporated in its entirety herein by reference.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. It is also noted that like reference numerals are used to designate identical or corresponding parts throughout the several views. The concentration of each component of the electrolyte to be mentioned below is based on the amount of the electrolyte.

A copper-plating electrolyte according to the present invention is a mixture of an aqueous copper salt solution, and aqueous additives such as disulfide (or sulfonic acid salt), polyethylene glycol, a naphthol compound, and polyvinylpyrrolidone. Here, the aqueous copper salt solution contains a copper salt and an acid. In specific embodiments, copper sulfate ($CuSO_4$) is used as the copper salt, but other salts can also be used as the copper salt. In further specific embodiments, sulfuric acid ($H_2SO_4$) is mainly used as the acid, but any acid such as hydrofluoric acid or methanesulfonic acid can also be used as the acid. In additional specific embodiments, the copper salt solution can include a chlorine source such as hydrochloric acid (HCl) or sodium chloride (NaCl).

The disulfide contained in the copper-plating electrolyte according to the present invention has the formula $XO_3S(CH_2)_3SS(CH_2)_3SO_3X$, and the sulfonic acid or salt thereof is mercaptopropanesulfonic acid or a sodium (or potassium) salt having the formula $HS(CH_2)_3SO_3X$, wherein X is sodium (Na), potassium (K), or hydrogen. To form a glossy copper plated layer with a smooth surface, it is preferable that the amount of disulfide or sulfonic acid or salt thereof serving as a brightener is in the range from about 0.001 to about 1.0 g/liter.

The polyethylene glycol contained in the inventive copper-plating electrolyte preferably has a molecular weight ranging from about 4,600 to about 10,000. The amount of the polyethylene glycol can be varied in the wide range from about 0.001 to about 10 g/liter without degradation of filling characteristic of the resultant electrolyte. The polyethylene glycol can be a mixture of two or more polyethylene glycols having different molecular weights.

Meanwhile, to enhance the filling characteristic of the electrolyte with respect to a fine pattern less than 1 μm, a naphthol compound is added as a wetting agent. The naphthol compound contained in the inventive copper-plating electrolyte is a water-soluble β-naphtholethoxylate having the formula

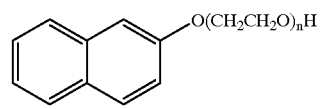

wherein n is an integer from 10 to 24. Preferably, the amount of β-naphtholethoxylate is in the range from about 0.05 to about 3.0 g/liter, and more preferably, in the range from about 0.5 to about 1.0 g/liter.

Also, to improve the flatness of the copper plated layer, a polyvinylpyrrolidone is added to the copper-plating electrolyte according to the present invention. The polyvinylpyrrolidone preferably has a molecular weight ranging from about 10,000 to about 1,300,000. The reason for adding the polyvinylpyrrolidone as a leveler is that overplating on the region in which a relatively large number of fine patterns are formed can be effectively improved by only the naphthol compound, which will be apparent in the comparative examples below. Preferably, the amount of polyvinylpyrrolidone is in the range from about 0.001 to about 0.2 g/liter.

The present invention will be described in greater detail by means of the following examples. The following examples are for illustrative purposes and are not intended to limit the scope of the invention.

EXAMPLE 1

An aqueous copper salt solution containing 17 g copper, 180 g sulfuric acid, and 70 mg HCl per 1 liter of the copper salt solution was used. To this solution, 0.005 g mercaptopropanesulfonic acid sodium salt, 0.0068 g of a polyethylene glycol having a molecular weight of 8000, 0.68 g β-naphtholethoxylate (n=14), and 0.002 g of a polyvinylpyrrolidone having a molecular weight of 29,000 were added with respect to 1 liter of the resultant copper-plating electrolyte according to the present invention.

The copper-plating electrolyte according to the present invention was prepared by mixing the additives with the non-aqueous copper salt solution. Then, electroplating was carried out using the copper-plating electrolyte at a temperature of 23 degrees celsius with a current density of 15 mA/cm$^2$. As a result, a copper plated layer with smooth surface without pitting was formed on a cathode or wafer.

EXAMPLE 2

A copper-plating electrolyte was prepared and a copper plated layer was formed in the same manner as in Example 1, except that the polyvinylpyrrolidone was added in the amount of 0.01 g per 1 liter of the electrolyte. As a result, a plated layer similar to that of Example 1, having a smooth surface without pitting, was formed.

EXAMPLE 3

A copper-plating electrolyte was prepared and a copper plated layer was formed in the same manner as in Example 1, except that the polyvinylpyrrolidone was added in the amount of 0.2 g per 1 liter of the electrolyte. As a result, a plated layer similar to that of Example 1, having a smooth surface without pitting, was formed.

EXAMPLE 4

A copper-plating electrolyte was prepared by adding 0.01 g mercaptopropanesulfonic acid sodium salt, 0.05 g of a polyethylene glycol having a molecular weight of 4,600, 0.04 g of a polyethylene glycol having a molecular weight of 8,000, 0.01 g of a polyvinylpyrrolidone having a molecular weight of 29,000, and 0.68 g β-naphtholethoxylate (n=14), on the basis of 1 liter of the resulting electrolyte, to the aqueous copper solution used in Example 1. A copper plated layer having the same properties as in Example 1 was obtained.

A substrate with trenches or via holes was plated with the copper-plating electrolyte according to the present invention, and the filling characteristic and the flatness of the plated copper layer were evaluated in the following experimental examples and comparative examples.

EXPERIMENTAL EXAMPLE 1

As mentioned previously, electroplating was performed on a substrate having a fine pattern of 1 μm with the copper-plating electrolyte according to the present invention, to test if the inventive copper-plating electrolyte has a good filling characteristic and results in a plated layer having a satisfactory flatness. FIG. 1 schematically illustrates a section of a substrate used in the experiment. The substrate 100 was a SiO$_2$ film used as an interlevel dielectric (ILD) film in which interconnects of a semiconductor device are usually formed, and the SiO$_2$ film was etched into trenches 102 having a critical dimension (CD) of 0.35 μm, 0.5 μm, or 3.5 μm, and a depth of 1.5 μm. As a result, the aspect ratios of the trenches 102 ranged between about 0.4 and 4. The trenches 102 were formed by a conventional photo process and dry etch process.

The composition of the aqueous copper salt solution used in this experimental example was the same as that used in Example 1. 0.001 g mercaptopropanesulfonic acid sodium salt, 0.0068 g of a polyethylene glycol having a molecular weight of 8,000, 0.0068 g β-naphtholethoxylate (n=14), and 0.002 g of a polyvinylpyrrolidone having a molecular weight of 29,000, on the basis of 1 liter of the electrolyte, were used as additives.

A thin copper seed layer serving as an anode was formed on the substrate having the trenches 102 by non-electroplating. The substrate with the copper seed layer was immersed in the electrolyte to perform electroplating. The electroplating was performed at a temperature of 23 degrees celsius with a current density of 15 mA/cm$^2$.

Figure 2A:
FIGS. 2A and 2B are scanning electron microscope (SEM) photos of the sections of the substrate having the copper layer plated in Experimental Example 1.
Figure 2B:
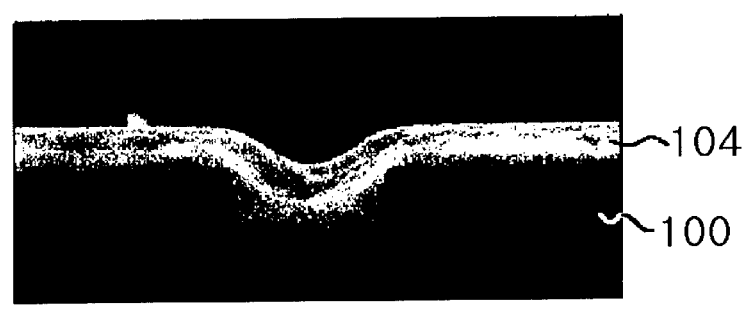

FIGS. 2A and 2B are scanning electron microscope (SEM) photos of a copper plated layer 104 formed on the substrate 100 formed in the above processes. FIG. 2A shows a section of the region with the trenches having a CD of 0.35 μm and 0.5 μm, and FIG. 2B shows a section of the region having the trench having a CD of 3.5 μm. The thickness of the plated layer is uniform over each of the regions. Overplating, which would deteriorate the flatness of the copper plated layer, does not occur in the region in which many trenches are formed with narrow spacing, as shown in FIG. 2A. Also, no voids occur within the 0.35-μm trench. This shows that the inventive copper-plating electrolyte has an excellent filling characteristic.

EXPERIMENTAL EXAMPLE 2

Electroplating was carried out with the same aqueous copper salt solution under the same conditions as in Experimental Example 1, except that the amounts of the additives used were varied: 0.01 g mercaptopropanesulfonic acid sodium salt, 0.03 g polyethylene glycol, 0.05 g β-naphtholethoxylate (n=14), and 0.02 g polyvinylpyrrolidone, on the basis of 1 liter of the electrolyte, were added. No overplating occurred in this example, as in Experimental Example 1, and the filling characteristic with respect to the trench having a CD of 0.35 μm was also excellent.

COMPARATIVE EXAMPLE 1

Unlike Experimental Example 1, polyvinylpyrrolidone was not added. As additives, 0.005 g mercaptopropanesulfonic acid sodium salt, 0.0068 g polyethylene glycol, and 0.68 g β-naphtholethoxylate (n=14), on the basis of 1 liter of the electrolyte, were used. Then, a substrate was plated in the same way as that in Experimental Example 1. Here, the composition of the aqueous copper salt solution used was the same as that used in Experimental Example 1.

Figure 3A:
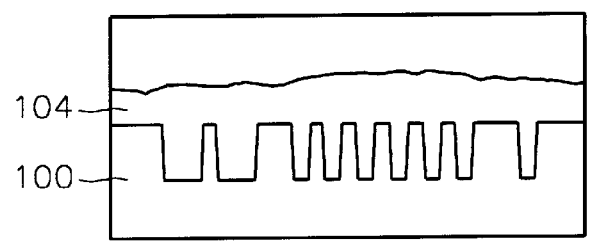
FIGS. 3A and 3B are schematic illustrations from SEM photos of the sections of a plated layer deposited on a substrate using a conventional electrolyte.
Figure 3B:
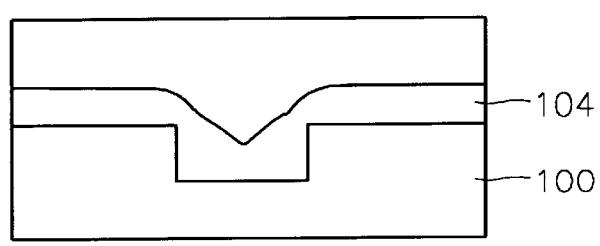

FIGS. 3A and 3B are schematic illustrations from SEM photos of a section of the substrate 100 plated with the electrolyte of Comparative Example 1. As shown in FIG. 3A, the trenches having a CD of 0.35 μm can be fully filled with the plated layer 104 without occurrence of voids therein. This shows that the filling characteristic of the electrolyte prepared in Comparative Example 1 is excellent. However, overplating occurs in the region having many trenches formed with narrow spacing, as shown in FIG. 3A, so that the projecting plated layer 104 results. Meanwhile, the plate layer 104 in the region having the 3.5-μm trench becomes thin, as shown in FIG. 3B. The resultant plated layer 104 has poor uniformity.

COMPARATIVE EXAMPLE 2

Unlike Experimental Example 1, no naphthol compound was added. As additives, 0.01 g mercaptopropanesulfonic acid sodium salt, 0.09 g polyethylene glycol, and 0.01 g polyvinylpyrrolidone, on the basis of 1 liter of the electrolyte, were used. Then, a substrate was plated in the same way as that in Experimental Example 1. Here, the composition of the aqueous copper salt solution used was the same as that used in Experimental Example 1. No overplating occurs. However, voids occur in the trench having a CD of 0.35 μm due to the poor filling characteristic of the electrolyte.

COMPARATIVE EXAMPLE 3

An electroplating was carried out with the electrolyte which contains no naphthol compound or polyvinylpyrrolidone. As additives, 0.005 g mercaptopropanesulfonic acid sodium salt, and 5 g polyethylene glycol, on the basis of 1 liter of the electrolyte, were used. The same electroplating process as in Experimental Example 1 was applied. The electrolyte shows a good filling characteristic for the 0.35-μm trench. However, thinning of the plated layer formed over the 3.5-μm trench occurs. The resultant plated layer has poor surface uniformity.

As described above, the copper-plating electrolytes of Experimental Examples 1 and 2 have good filling characteristic, and a copper plated layer having a flat surface can be formed with the copper-plating electrolytes.

Hereinafter, the filling characteristic of the copper-plating electrolyte according to the present invention will be examined in greater detail by comparison with a common copper-plating electrolyte. The electrolyte used has the same composition as the electrolyte of Experimental Example 1. To prepare a common copper-plating electrolyte, A2001, which is known to have an excellent filling characteristic and is produced by Shipley Company Inc., was used as the additive.

Figure 4A:
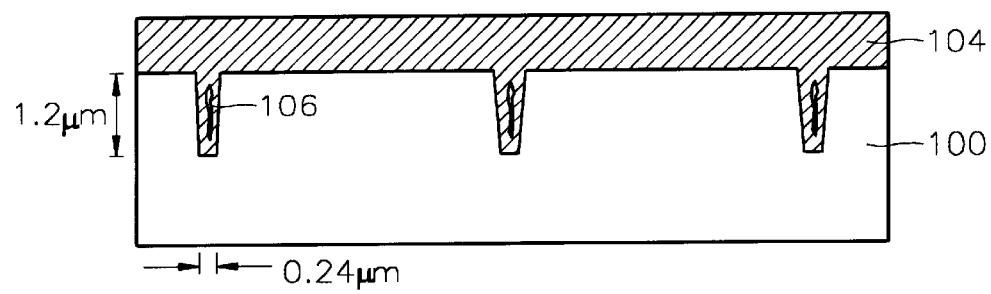
FIGS. 4A and 4B are schematic sectional views comparatively showing the filling characteristics of the inventive copper-plating electrolyte and a common copper-plating electrolyte.
Figure 4B:
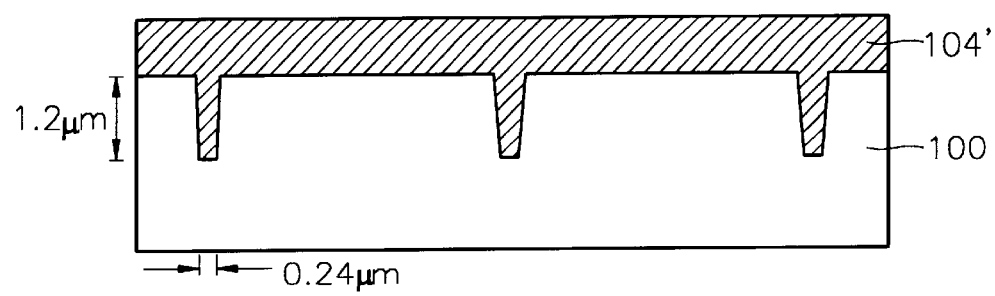

In order to examine the filling characteristics, electroplating was performed on $SiO_2$ substrates with via holes having a height of 1.2 μm and a diameter of 0.24 μm. The sections of the substrates plated with the common electrolyte, and with the inventive electrolyte, are shown in FIGS. 4A and 4B, respectively. FIGS. 4A and 4B are schematic illustrations from SEM photos of the sections. In particular, FIG. 4A shows the substrate 100 and the plated layer 104 formed with the common electrolyte, and FIG. 4B shows the substrate 100 and the plated layer 104 formed with the inventive copper-plating electrolyte. When the substrate 100 is plated by the electrolyte according to the present invention, as shown in FIG. 4B, no voids occur within the via holes. In contrast, when the substrate 100 is plated by the electrolyte to which the common additive is added, voids 104 are formed in the longitudinal direction of the via holes, as shown in FIG. 4A. Thus, it is concluded that the copper-plating electrolyte according to the present invention does not cause overplating of the plated layer, and having an excellent filling characteristic, compared with the common copper-plating electrolyte.

As previously mentioned, the copper-plating electrolyte according to the present invention, which contains a sodium salt of mercaptopropanesulfonic acid, polyethylene glycol, a β-naphtholethoxylate (n=14) and a polyvinylpyrrolidone as additives, can fill a via hole or trench having a CD less than 0.3 μm and an aspect ratio larger than 4 without occurrence of voids therein. In addition, the inventive copper-plating electrolyte does not cause overplating of the plated layer over the region on which many narrow trenches are concentrated. Accordingly, the resistance characteristic in the via hole or trench does not deteriorate. The surface of the resultant plated layer has excellent flatness, so that possible defects occurring during a subsequent process performed after the electroplating, such as a CMP process, can be prevented.

While this invention has been particularly shown and described with reference to preferred embodiments thereof, it will be understood by those skilled in the art that various changes in form and details may be made therein without departing from the spirit and scope of the invention as defined by the appended claims.

What is claimed is:
1. A copper-plating electrolyte comprising:
   (a) an aqueous copper salt solution;
   (b) a water-soluble β-naphtholethoxylate compound having the formula

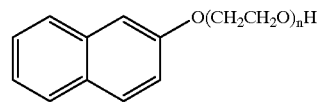

wherein n is an integer from to 10 to 24;
   (c) one selected from the group consisting of a disulfide having the formula $XO_3S(CH_2)_3SS(CH_2)_3SOX_3$ and a water-soluble mercaptopropanesulfonic acid or salt thereof having the formula $HS(CH_2)_3SO_3X$, wherein X is sodium, potassium, or hydrogen;
   (d) a water-soluble polyethylene glycol having a molecular weight ranging from about 4,600 to about 10,000; and
   (e) a water-soluble polyvinylpyrrolidone having a molecular weight ranging from about 10,000 to about 1,300,000.
2. The copper-plating electrolyte of claim 1, wherein the aqueous copper salt solution (a) comprises a copper salt and an acid.
3. The copper-plating electrolyte of claim 2, wherein the copper salt is copper sulfate.
4. The copper-plating electrolyte of claim 2, wherein the acid is sulfuric acid.
5. The copper-plating electrolyte of claim 2, further comprising a chlorine source.
6. The copper-plating electrolyte of claim 2, wherein the aqueous copper salt solution (a) is an aqueous solution containing copper, sulfuric acid, and hydrochloric acid.
7. The copper-plating electrolyte of claim 1, wherein the amount of the disulfide or the mercaptopropanesulfonic acid or salt thereof (c) is in the range from about 0.001 to about 0.05 g per liter.
8. The copper-plating electrolyte of claim 1, wherein the amount of the polyethylene glycol (d) is in the range from about 0.001 to about 10 g per liter.
9. The copper-plating electrolyte of claim 1, wherein the polyethylene glycol (d) comprises a mixture of at least two polyethylene glycols having different molecular weights.
10. The copper-plating electrolyte of claim 1, wherein the amount of the β-naphtholethoxylate (b) is in the range from about 0.05 to about 3.0 g per liter.
11. The copper-plating electrolyte of claim 1, wherein the amount of the polyvinylpyrrolidone is in the range from about 0.001 to about 0.2 g per liter.
12. An electroplating method for forming a copper interconnect of a semiconductor device, the electroplating method comprising the steps of:
   (i) forming a predetermined pattern containing a trench or via hole on a semiconductor substrate; and
   (ii) electroplating the semiconductor substrate having the predetermined pattern with a copper-plating electrolyte comprising
      (a) an aqueous copper salt solution,
      (b) a water-soluble β-naphtholethoxylate compound having the formula

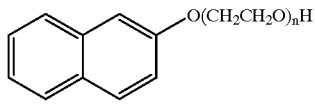

wherein n is an integer from 10 to 24, (c) one selected from the group consisting of a disulfide having the formula $XO_3S(CH_2)_3SS(CH_2)_3SOX_3$ and a water-soluble mercaptopropanesulfonic acid or salt thereof having the formula $HS(CH_2)_3SO_3X$, where X is sodium, potassium, or hydrogen, (d) a water-soluble polyethylene glycol having a molecular weight ranging from about 4,600 to about 10,000, and (e) a water-soluble polyvinylpyrrolidone having a molecular weight ranging from about 10,000 to about 1,300,000.

13. The method of claim 12 wherein the predetermined pattern contains a trench or via hole having a critical dimension (CD) less than about 1 $\mu$m and an aspect ratio larger than about 4.

14. The method of claim 12, wherein the aqueous copper salt solution (a) is an aqueous solution containing copper, sulfuric acid, and hydrochloric acid.

15. The method of claim 12, wherein the amount of the disulfide or the mercaptopropanesulfonic acid or salt thereof (c) is in the range from about 0.001 to about 0.05 g per liter.

16. The method of claim 12, wherein the amount of the polyethylene glycol (d) is in the range from about 0.001 to about 10 g per liter.

17. The method of claim 12, wherein the polyethylene glycol (d) comprises a mixture of at least two polyethylene glycols having different molecular weights.

18. The method of claim 12, wherein the amount of the β-naphtholethoxylate compound (b) is in the range from about 0.05 to about 3.0 g per liter.

19. The method of claim 12, wherein the amount of the polyvinylpyrrolidone (e) is in the range of about 0.001 to about 0.2 g per liter.

* * * * *